United States Patent [19]

Goronkin et al.

[11] 3,999,281
[45] Dec. 28, 1976

[54] METHOD FOR FABRICATING A GRIDDED SCHOTTKY BARRIER FIELD EFFECT TRANSISTOR

[75] Inventors: Herbert Goronkin, Wenham, Mass.; Richard W. Aldrich, Liverpool, N.Y.

[73] Assignee: The United States of America as represented by the Secretary of the Air Force, Washington, D.C.

[22] Filed: Jan. 16, 1976

[21] Appl. No.: 649,763

[52] U.S. Cl. .................................. 29/571; 29/578; 29/580; 357/15; 357/22
[51] Int. Cl.² .......................................... B01J 17/00
[58] Field of Search ................... 29/571, 578, 580; 357/15, 22

[56] References Cited
UNITED STATES PATENTS

| | | | |
|---|---|---|---|
| 3,675,313 | 7/1972 | Driver | 357/22 |
| 3,920,861 | 11/1975 | Dean | 357/22 |
| 3,938,241 | 2/1976 | George | 29/571 |

*Primary Examiner*—W. Tupman
*Attorney, Agent, or Firm*—Joseph E. Rusz; George Fine

[57] ABSTRACT

A method is provided for fabricating a gridded Schottky barrier field effect transistor and to the transistor produced thereby. The transistor is constructed by means of a single high resolution mask which does not require alignment to any reference line. Utilizing the masking properties of an oxidation layer on the sides of the etched slots, platinum is deposited only at the bottom of the groove thereby eliminating the requirement of an additional photo-masking step or the necessity of subsequent removal of platinum from other surfaces of the wafer.

2 Claims, 2 Drawing Figures

METHOD FOR FABRICATING A GRIDDED SCHOTTKY BARRIER FIELD EFFECT TRANSISTOR

STATEMENT OF GOVERNMENT INTEREST

The invention described herein may be manufactured and used by or for the Government for governmental purposes without the payment of any royalty thereon.

BACKGROUND OF THE INVENTION

Present metal semiconductor field effect transistors (MESFETS) for microwave applications require several high resolution masks which must be mutually registered with tolerances approaching small fractions of a micron. The present invention describes a method to fabricate a MESFET or JFET (Junction FET) with higher performance than heretofore possible, by the use of a single high resolution mask which does not require alignment to any reference line.

Also, in the prior art the gridistor, a JFET, incorporated a diffused buried island gate geometry to achieve a high packing density of active regions and reduction of parasitics due to passive regions of the semiconductor. The gates, in one such device, are $p^+$ regions which are not ideal because of intrinsic high series resistance and consequential minority carrier storage if operated in forward bias. Using this structure, there has been achieved 1 watt at 1 GHz. Metal gates forming Schottky barriers to n-type semiconductor do not have these disadvantages. However, it is a difficult technical problem to simply supplant the $p^+$ islands with metal since subsequent high temperature processing can result in either deterioration of the Schottky barrier or structural damage to the semiconductor due to thermal mismatch.

The present invention describes a method to fabricate a five geometry Gridistor employing metal gates by a modification of the original geometry. In addition to lower series resistance of the gates and absence of minority carrier effects the material over the gate islands is air rather than semiconductor. Thus parasitics are reduced and in one of two variations the source and drain can be isolated by air.

SUMMARY OF THE INVENTION

There is provided a method for fabricating a Schottky barrier field effect transistor, and to the device produced thereby. The transistor is constructed by means of a single high resolution mask which does not require alignment to any reference line. Utilizing the masking properties of an oxidation layer on the sides of etched slots, platinum is deposited only at the bottom of the groove, thereby eliminating the requirement of an additional photo masking step or the necessity of subsequent removal of platinum from other surfaces of the wafer.

DETAILED DESCRIPTION OF THE PREFERRED EMBODIMENT

Figure 1:
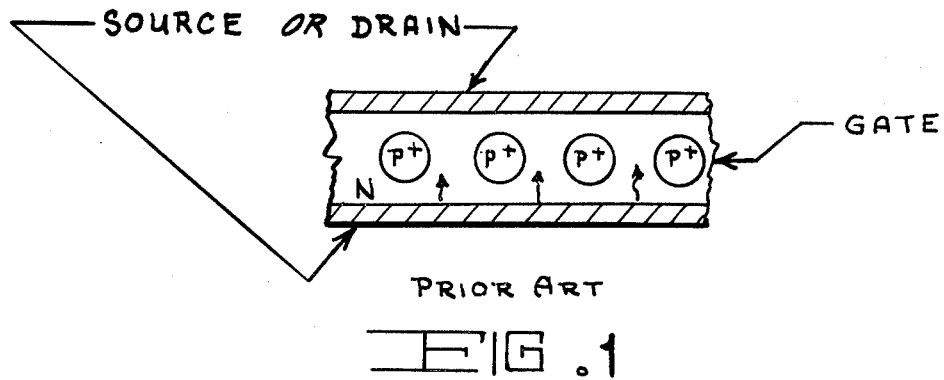
FIG. 1 shows a portion of the prior art gridistor in cross section.

Now referring to FIG. 1 showing a prior art gridistor cross section to explain the present invention, the gridistor was first described by S. Teszner in Le Gridistor, "Successeur du tecnetrors", Ann Telecommunications, 21 (1966). It incorporates a diffused buried island gate geometry to achieve a high packing density of active regions and reduction of parasitics due to passive regions of the semiconductor. The gates are $p^+$ regions which are not ideal because of intrinsic high series resistance and consequential minority carrier storage if operated in forward bias. This structure has achieved 1 watt at 1 GHz as described by P. Durand and J. LaPlanche, Elec. Ltrs., 8, 12 (1972). Metal gates forming Schottky barriers to the n-type semiconductor do not have these disadvantages.

Figure 2:
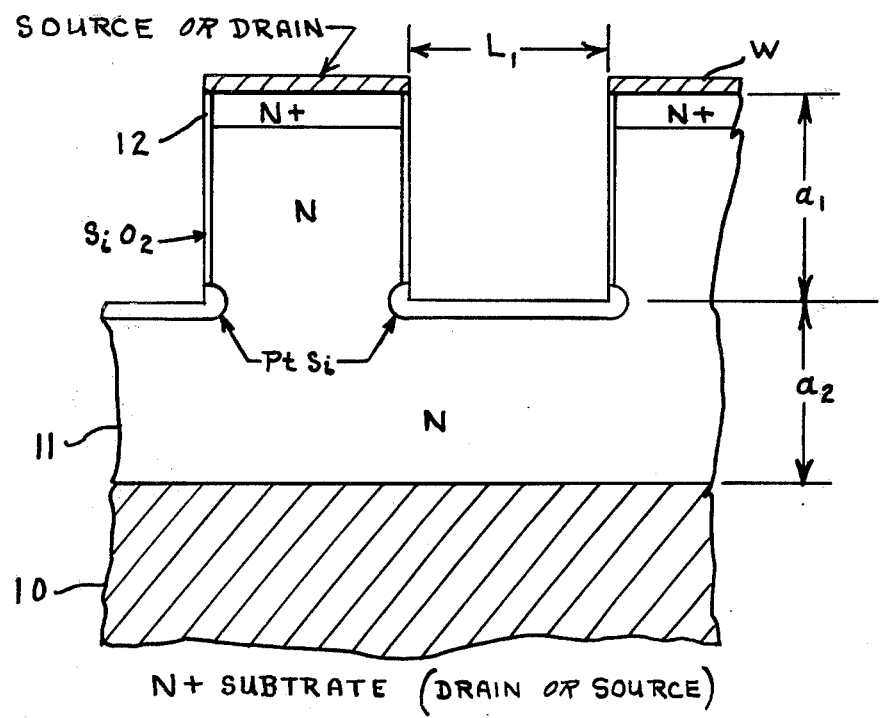
FIG. 2 shows a portion of the Schottky barrier gridistor fabricated by the method of the present invention.

The present invention, as illustrated in FIG. 2, provides a method to fabricate a fine geometry gridistor employing metal gates by a modification of the original geometry. Substrate 10 is $n^+$ silicon. Silicon is used only as an example; III–V compounds may be even more advantageous. When metallized, it is either the source or drain due to symmetry. N-silicon epitaxial layer 11 is provided and it is further coated with $n^+$ silicon 12 — either epitaxial or diffused — and a final refractory metal (e.g., tungsten) for ohmic contact.

A single high resolution photo mask is placed over the photoresist-coated tungsten and stripes defining the slotted region are exposed. With the photoresist protecting the metal, slots are sputter etched into the n-silicon. Using this technique, photoresist holds up to sputter etching and the sides of the slots are normal to the surface. Platinum is deposited. Alloying forms PtSi, a good Schottky barrier on silicon. A subsequent wash in aqua regia removes the unalloyed platinum and the device is finished, except for separation from the wafer.

The following steps outline the process in detail for a more comprehensive exposition. First, epitaxially there is grown $n$ on $n^+$, where $t = a_1 + a_2 \simeq 1$-2 microns, $t$ being the thickness of the aforementioned $n$ on $n^+$ with $t$, $a_1$ and $a_2$ being illustrated in FIG. 2. The second step is growing $n^+$ or diffusing $n^+$ into thicker original film, $\sim 1\mu$. The third step is the depositing refractory metal, tungsten on $n^+$, for ohmic contact. The fourth step is masking for $L_1$ (the width of the slot) so that $L_1 = 0.5$ to 1.0 micron (leave on photoresist after exposure and development). The fifth step is to sputter etch grooves to depth $a = 0.5$ to 1.5 micron. The sixth step is to oxidize the wafer to 0.1 to 0.2 micron. The seventh step is sputter etching the bottom of groove. There is no mask required. The eighth step is depositing $Pt$, $\sim 400$ to 500 A. The ninth step is sintering $Pt$ from PtSi. The tenth step is removing the excess $Pt$ by $Pt$ wash in aqua regia.

A sample calculation for 1 micron geometry for a 10 × 10 mil chip size results in:

F Max > 28 GHz
Po = 3.2 Watts
$V_{DM}$ = 21 Volts
I peak = 1.4 Amp.

Alternately, an insulating substrate may be used. All following steps are the same, but the grid geometry is slightly altered to allow use of alternate upper contacts as source — drain — source — drain —, etc. In this configuration, F Max is reduced, but so are parasitics as the semiconductor under the gate regions now constitutes an active region rather than passive.

What is claimed is:

1. A method of fabrication of a Schottky barrier field effect transistor in a wafer by the use of a single high resolution mask without requiring alignment to any reference line being comprised of epitaxially growing $n$ on $n^+$ the combination having a thickness of 1 to 2 microns, growing $n^+$ into the thicker original film in the order of 1 $\mu$, depositing refractory metal of tungsten on $n^+$ for ohmic contact, masking for grooves in the order of 0.5 to 1 micron, forming said grooves in said grown surface, oxidizing the wafer to 0.1 to 0.2 microns, sputter etching the bottom of said grooves without a mask, depositing P$t$ in the order of 400 to 500 A, sintering P$t$ to PtSi, and removing excess P$t$ by washing in aqua regia.

2. A method of fabrication as described in claim 1 wherein the step of masking for grooves in the order of 0.5 to 1 micron includes thereafter leaving on photoresist after exposure and development.

* * * * *